United States Patent
Chandrasekher et al.

(10) Patent No.: US 11,626,887 B1
(45) Date of Patent: Apr. 11, 2023

(54) BYTE-BASED ERROR CORRECTION TO IMPROVE FOR WIRELESS NETWORKS

(71) Applicant: Aira Technologies, Inc., Saratoga, CA (US)

(72) Inventors: Anand Chandrasekher, Saratoga, CA (US); Ravikiran Gopalan, Cupertino, CA (US); Arman Rahimzamani, San Jose, CA (US)

(73) Assignee: Aira Technologies, Inc., Saratoga, CA (US)

( * ) Notice: Subject to any disclaimer, the term of this patent is extended or adjusted under 35 U.S.C. 154(b) by 0 days.

(21) Appl. No.: 17/743,307

(22) Filed: May 12, 2022

(51) Int. Cl.
*H03M 13/00* (2006.01)
*H03M 13/09* (2006.01)
*H04L 1/00* (2006.01)

(52) U.S. Cl.
CPC ......... *H03M 13/09* (2013.01); *H03M 13/611* (2013.01); *H04L 1/0061* (2013.01)

(58) Field of Classification Search
CPC .... H03M 13/09; H03M 13/611; H04L 1/0061
See application file for complete search history.

(56) References Cited

U.S. PATENT DOCUMENTS

| | | | | |
|---|---|---|---|---|
| 6,128,706 A | * | 10/2000 | Bryg ................... | G06F 9/3834 711/146 |
| 7,047,479 B1 | * | 5/2006 | Hagh-Panah ....... | H03M 13/091 714/758 |
| 2005/0172205 A1 | * | 8/2005 | Lin .................... | H03M 13/091 714/758 |
| 2005/0195770 A1 | * | 9/2005 | Baliga ................. | H04B 1/7073 370/335 |

* cited by examiner

*Primary Examiner* — Samir W Rizk
(74) *Attorney, Agent, or Firm* — Carr & Ferrell LLP

(57) ABSTRACT

Improved error correction systems and methods for wireless networks are described herein. A method can include generating a first cyclic redundancy code (CRC) for a payload of a data packet by executing cycles for sets of input bytes from the payload using a CRC algorithm so as to reduce a number of the cycles required to generate the first CRC when compared to generating the first CRC from individual bits of the payload, appending the first CRC to the payload of the data packet, and transmitting the data packet over a wireless link from a source to a sink.

18 Claims, 7 Drawing Sheets

BYTE-BASED ERROR CORRECTION TO IMPROVE FOR WIRELESS NETWORKS

CROSS-REFERENCE TO RELATED APPLICATIONS

N/A.

FIELD OF THE PRESENT TECHNOLOGY

The present disclosure pertains to the technical field of wireless communications, and more specifically, but not by way of limitation, to systems and methods that improve error correction processes in wireless communications.

SUMMARY

Some embodiments of the present disclosure provide byte-based cyclic redundancy code (CRC) that improves performance of wireless networks. These embodiments can include both systems and methods.

According to some embodiments, the present disclosure is directed to a method comprising generating a first cyclic redundancy code (CRC) for a payload of a data packet by executing cycles for sets of input bytes from the payload using a CRC algorithm so as to reduce a number of the cycles required to generate the first CRC when compared to generating the first CRC from individual bits of the payload; appending the first CRC to the payload of the data packet; and transmitting the data packet over a wireless link from a source to a sink.

According to some embodiments, the present disclosure is directed to a system comprising a source configured to: generate a first cyclic redundancy code (CRC) for a payload of a data packet by executing cycles for sets of input bytes from the payload using a CRC algorithm so as to reduce a number of the cycles required to generate the first CRC when compared to generating the first CRC from individual bits of the payload; append the first CRC to the payload of the data packet; and transmit the data packet over a wireless link; and a sink configured to: calculate a second CRC by the sink; compare the second CRC with the first CRC; and transmit a message to the source over the wireless link that indicates whether the second CRC calculated by the sink matches the first CRC by the source.

According to some embodiments, the present disclosure is directed to a method comprising generating a first cyclic redundancy code (CRC) by executing cycles for sets of input bytes from a payload by processing an initialized CRC register in combination with pre-computed values stored in a lookup table; appending the first CRC to the payload of the data packet; and transmitting the data packet over a wireless link from a source to a sink.

BRIEF DESCRIPTION OF THE DRAWINGS

Certain embodiments of the present technology are illustrated by the accompanying figures. It will be understood that the figures are not necessarily to scale and that details not necessary for an understanding of the technology or that render other details difficult to perceive may be omitted. It will be understood that the technology is not necessarily limited to the particular embodiments illustrated herein.

DETAILED DESCRIPTION

Overview

Wireless protocols include a set of rules or agreed-upon guidelines for communication. These rules are used in the design of hardware and software that governs data transmission over the air. One example wireless protocol includes BLUETOOTH, although the present disclosure is not limited to application to BLUETOOTH protocol.

When a device is transmitting data packets over a network according to a protocol, errors may be introduced due to attenuation in the wireless channel. One method of identifying and correcting these errors involves the use of a cyclic redundancy check (CRC). CRC is a short error-detecting code to detect accidental payload changes. CRC is computed on the payload at the transmitter side (Tx also known as a source), and attached to the end of the payload. Both payload and CRC are transmitted to the receiver (Rx also known as a sink). At the receiver, the received CRC is compared to the CRC computed by the received payload. If the received CRC equals the computed CRC, the CRC passes. If the received CRC doesn't match the computed CRC, the CRC fails.

When CRC passes, it is of a very high probability that the packet is error-free, so the Rx can transmit an acknowledgment (ACK) to the Tx, to inform the Tx to continue to transmit the next packet. When CRC fails, it is of a very high probability that the packet is contaminated, so a no-acknowledgment (NACK) is triggered. When the Rx asks for retransmission using the NACK. In sum, when the Tx receives ACK, it will transmit the next packet; when the Tx receives NACK, it will re-transmit the packet.

Figure 1:
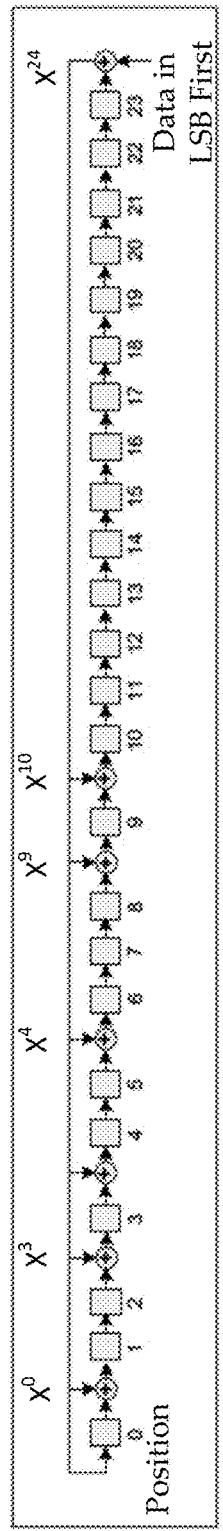
FIGS. 1 and 2 collectively illustrate a prior art process for generating a cyclic redundancy code.

While other protocols use CRC, in particular, in the BLUETOOTH protocol a CRC polynomial is a 24-bit CRC, and all bits in the PDU (Protocol Data Unit), hereinafter referred to as "payload" are be processed in transmitted order starting from the least significant bit. The polynomial has the form of $x24+x10+x9+x6+x4+x3+x+1$. A schematic diagram of an example prior art LFSR (linear feedback shift register) circuit generating a CRC is illustrated in FIG. 1.

Figure 2:
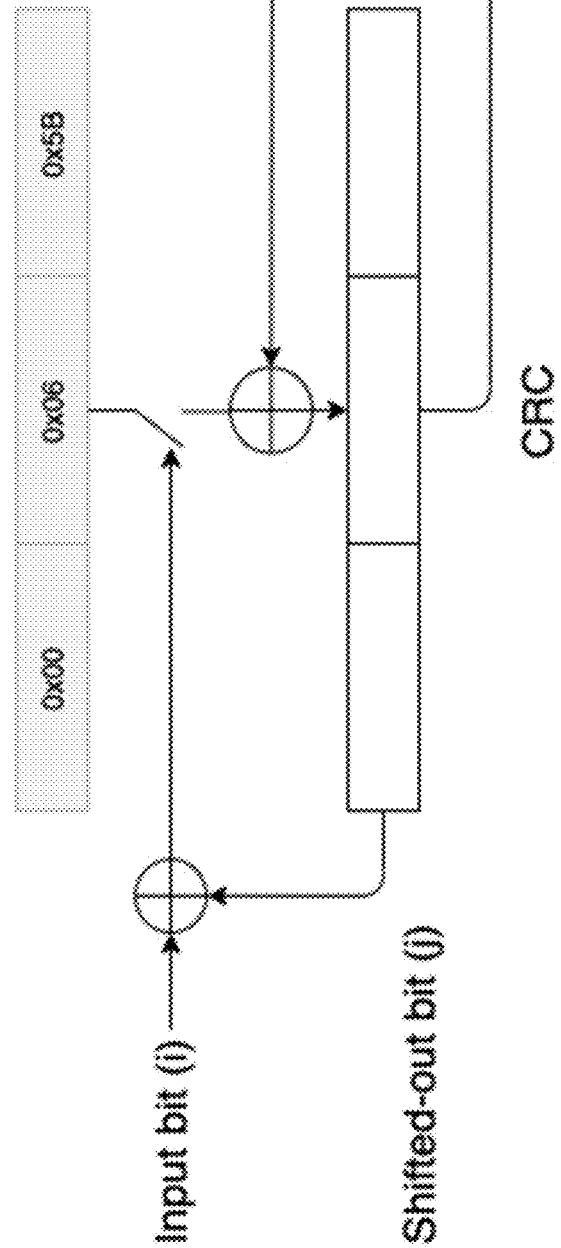

While this method can be used for CRC it is highly inefficient. FIG. 2 illustrates an example prior art method for generating a CRC using standard bit-wise processing. In a standard BLUETOOTH CRC implementation, a CRC in BLUETOOTH is a three-byte (24-bit) register and is equal to a remainder of a binary division of an input sequence over a fixed 24-bit number 0x00065B also known as a generator polynomial. CRC can be calculated as follows. In a first step, the CRC calculation is initialized as 0x555555 (which is the binary number 010101010101010101010101). A second step has two sub-parts. In the first, each input bit i (obtained from the payload) can involve shifting the CRC to the left by one. In the second part, the leftmost bit can be stored as j. It will be understood that if a logical operation XOR(i,j)=1, then the CRC is updated as CRC=XOR (CRC, 0x00065B).

That is, the CRC bit value being calculated is updated by applying a logical XOR operation to the pair of the CRC value and the generator polynomial. Once the bits of the payload have been fully processed into a CRC, it can be appended to a data packet behind the payload.

However, the process illustrated in FIG. 2 is highly inefficient and slow. The process is slow due to the fact that bits of the PDU/payload are input one by one and then a cycle of processing and register updating is executed for each single bit. So, for example, if the payload is 100 bytes (each byte comprising eight bits), the CRC algorithm needs to be executed 800 times.

Example Embodiments

Figure 3:
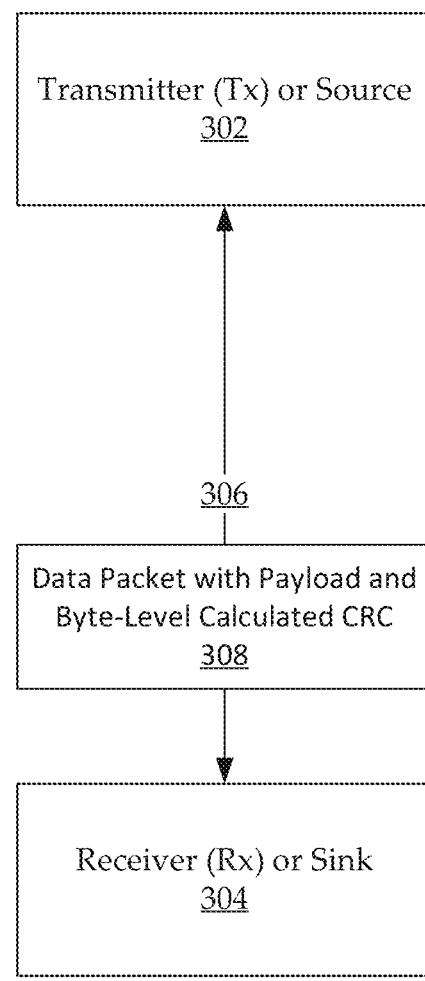
FIG. 3 is a schematic diagram of an example system where aspects of the present disclosure can be practiced.

Turning now to the drawings, and to FIG. 3, which is a schematic diagram of an example wireless environment. The environment may include a transmitter 302 (also known as a source), a receiver 304 (also known as a sink), and a wireless link 306. In some instances, the transmitter 302 and receiver 304 are configured to use a BLUETOOTH protocol to communicate with one another over the wireless link 306.

That is, each of the transmitter 302 and the receiver 304 are configured to use BLUETOOTH protocols. The transmitter 302 and receiver 304 are also configured to provide the byte-based CRC protocols disclosed herein.

Both the transmitter 302 and the receiver 304 each comprise a processor and memory. The memory stores instructions that can be executed by the processor to perform the various methods disclosed herein. In some embodiments, both the transmitter 302 and receiver 304 are each configured to perform improved byte-based CRC methods as disclosed herein. In some embodiments, the transmitter 302 can transmit to the receiver 304 a data packet with payload and byte-level calculated CRC 308.

For context, instead of using individual bits as disclosed above, the system of FIG. 3 inputs a batch of bits, referred to as an input byte, to a CRC calculator referred to as a CRC algorithm. The CRC algorithm can be programmed and enabled by both the transmitter and the receiver. Computational cycles are executed over the entire input bytes reduce the number of times or cycles the CRC algorithm needs to run and hence can increase the computational speed several times. Therefore, each byte is processed together instead of individual bits, then for 100 bytes, the loop needs to be executed only 100 times, rather than the example above which required 800 loops/cycles.

Figure 4:
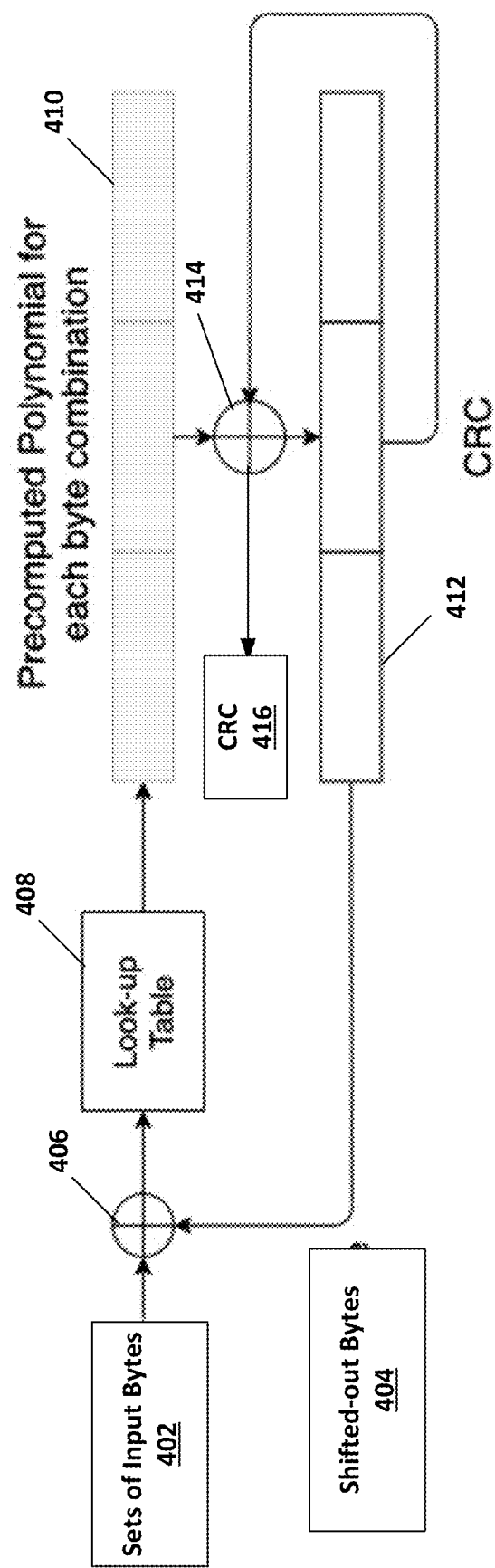
FIG. 4 is a schematic diagram of an example of a byte-based cyclic redundancy code process.

FIG. 4 is a schematic diagram of an example byte-based CRC process. The diagram comprises sets of input bytes 402, shifted-out bytes 404, a first logical operator 406, a lookup table 408, precomputed polynomial values 410 for each byte combination, CRC register 412 (byte-based), a second logical operator 414, and a resultant CRC 416. It will be understood that the first and second logical operators can be the same. In general, the method can be performed initially by a transmitter when composing a data packet. That is, the transmitter can generate a byte-based CRC that can be applied to a PDU/payload of the data packet. The CRC register can be initialized as 0x555555 (which is the binary number 010101010101010101010101).

In more detail, when considering the standard CRC calculation scheme, it will be understood that a leftmost byte of the generator polynomial is 0x00, (i.e., the leftmost 8 bits are all 0s). Thus, at any state of the CRC register, the eight consecutive shifted-out leftmost bits remain unchanged regardless of operations in the previous iterations. The full leftmost byte (i.e., eight bits of CRC) can be shifted out as-is. Therefore, instead of one bit at a time, using each input byte Bi, the CRC can be shifted to the left by eight bits. The leftmost byte can be stored as Bj.

Instead of doing one-bit shift and XOR iterations for CRC register updates for each bit of XOR(Bi,Bj), the linear nature of XOR and shift operations allows for pre-computation XOR and shift combinations needed to update CRC for each possible value of XOR(Bi,Bj). Stated otherwise, prior to generating the CRC, the transmitter can be configured to generate the lookup table 408. The lookup table 408 can be created by pre-computing XOR (first logical operator 406) values (e.g., logical operations performed on bytes) and shift combinations needed to update the CRC for each possible value of XOR(Bi,Bj), where Bi are input bytes obtained from the payload and Bj are shifted-out bytes. It will be understood that this can comprise a total of 256 possibilities, created from pairs of input bytes and shifted-out bytes, which have been processed using a logical operator such as XOR. The precomputed polynomial values 410 for each byte combination are processed in combination with the values in the CRC register 412 using the second logical operator 414 to create the CRC 416.

In general, bit-level CRC requires approximately 125 microseconds of compute time to process 100 bytes. In stark contrast, the systems and methods of byte-level CRC require only approximately 25 microseconds. While the bit-level CRC does not require memory operations, byte-level CRC as disclosed herein may require approximately 256 entries*four Bytes, or approximately one kilobyte of memory. However, lookup table memory access operations are computationally cheaper than performing loops or rounds of an CRC algorithm.

Figure 5:
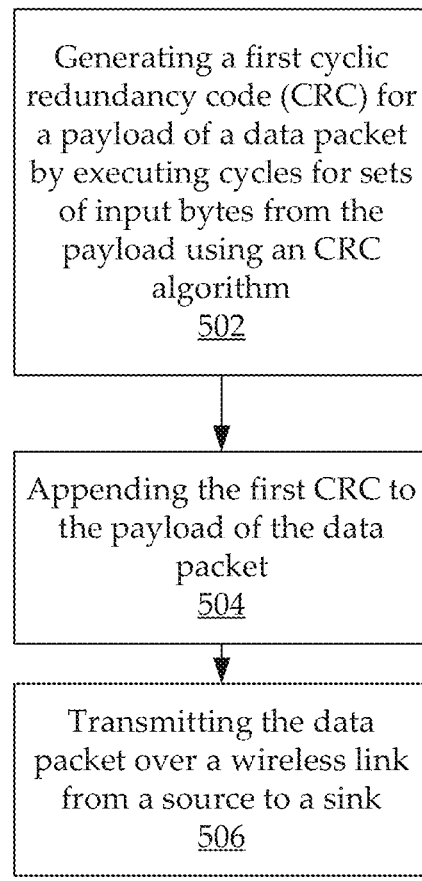
FIG. 5 is a flowchart of an example method of the present disclosure.

FIG. 5 is a flowchart of an example method. The method can include a step 502 of generating a first cyclic redundancy code (CRC) for a payload of a data packet by executing cycles for sets of input bytes from the payload using a CRC algorithm. As noted above, byte-level processing reduces a number of cycles required to generate the first CRC when compared to generating the first CRC from individual bits of the payload. Also, each of the sets of input bytes comprises at least eight bits. Next, the method includes a step 504 of appending the first CRC to the payload of the data packet, as well as a step 506 transmitting the data packet over a wireless link from a source to a sink.

Figure 6:
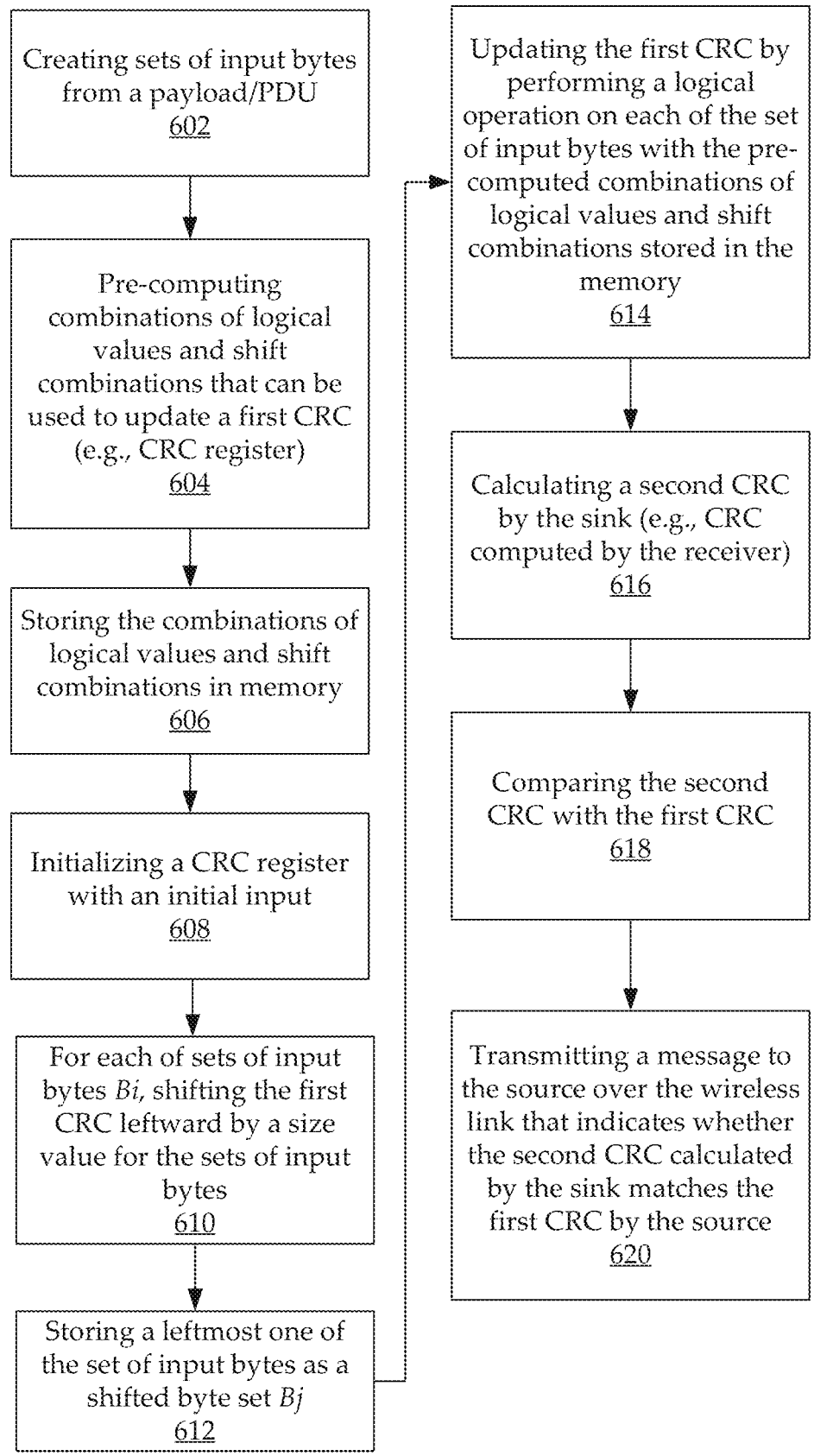
FIG. 6 is a flowchart of another example method of the present disclosure.

FIG. 6 is a flowchart of a detailed process for generating a first CRC using sets of bytes from a payload with a CRC algorithm. The method can include a step 602 of creating sets of input bytes from a payload/PDU. The method can also include a step 604 of pre-computing combinations of logical values and shift combinations that can be used to update a first CRC (e.g., CRC register). The method can also include a step 606 of storing the combinations of logical values and shift combinations in memory.

The method can include a step 608 of initializing a CRC register with an initial input. As noted above, the CRC register can be initialized as 0x555555 (which is a binary number 010101010101010101010101). Next, the method can include a step 610 where for each of sets of input bytes Bi, shifting the first CRC leftward by a size value for the sets of input bytes. In some embodiments, the method can include a step 612 of storing the leftmost one of the set of input bytes as a shifted byte set Bj.

According to some embodiments, the method can include a step 614 of updating the first CRC by performing a logical operation on each of the set of input bytes with the pre-computed combinations of logical values and shift combinations stored in the memory.

Once the CRC has been computed and appended to the payload of a data packet, the data packet can be transmitted to a receiver/sink. At the receiver, the received, first CRC can be compared to a second CRC computed by the receiver. The method can include a step 616 of calculating a second CRC by the sink (e.g., CRC computed by the receiver), as well as a step 618 of comparing the second CRC with the first CRC. Next, the method can include a step 620 of transmitting a message to the source over the wireless link that indicates whether the second CRC calculated by the sink matches the first CRC by the source. When the CRCs match, the transmitter can send a next packet. When the CRCs do not match, the receiver can ask the transmitter to retransmit the base packet (e.g., original data packet) or a correction packet that can be used to correct the errors in the payload/PDU.

Figure 7:
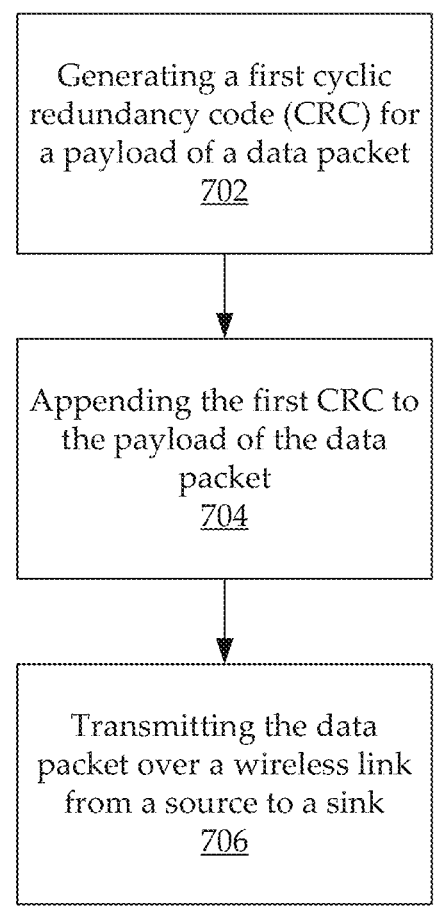
FIG. 7 is a flowchart of an additional example method of the present disclosure.

Referring now to FIG. 7, another example method can include a step 702 of generating a first cyclic redundancy code (CRC) for a payload of a data packet. The first cyclic redundancy code (CRC) can be created by executing cycles for sets of input bytes from the payload using an initialized CRC register in combination with pre-computed values stored in a lookup table. The method can include a step 704 of appending the first CRC to the payload of the data packet and a step 706 of transmitting the data packet over a wireless link from a source to a sink.

Figure 8:
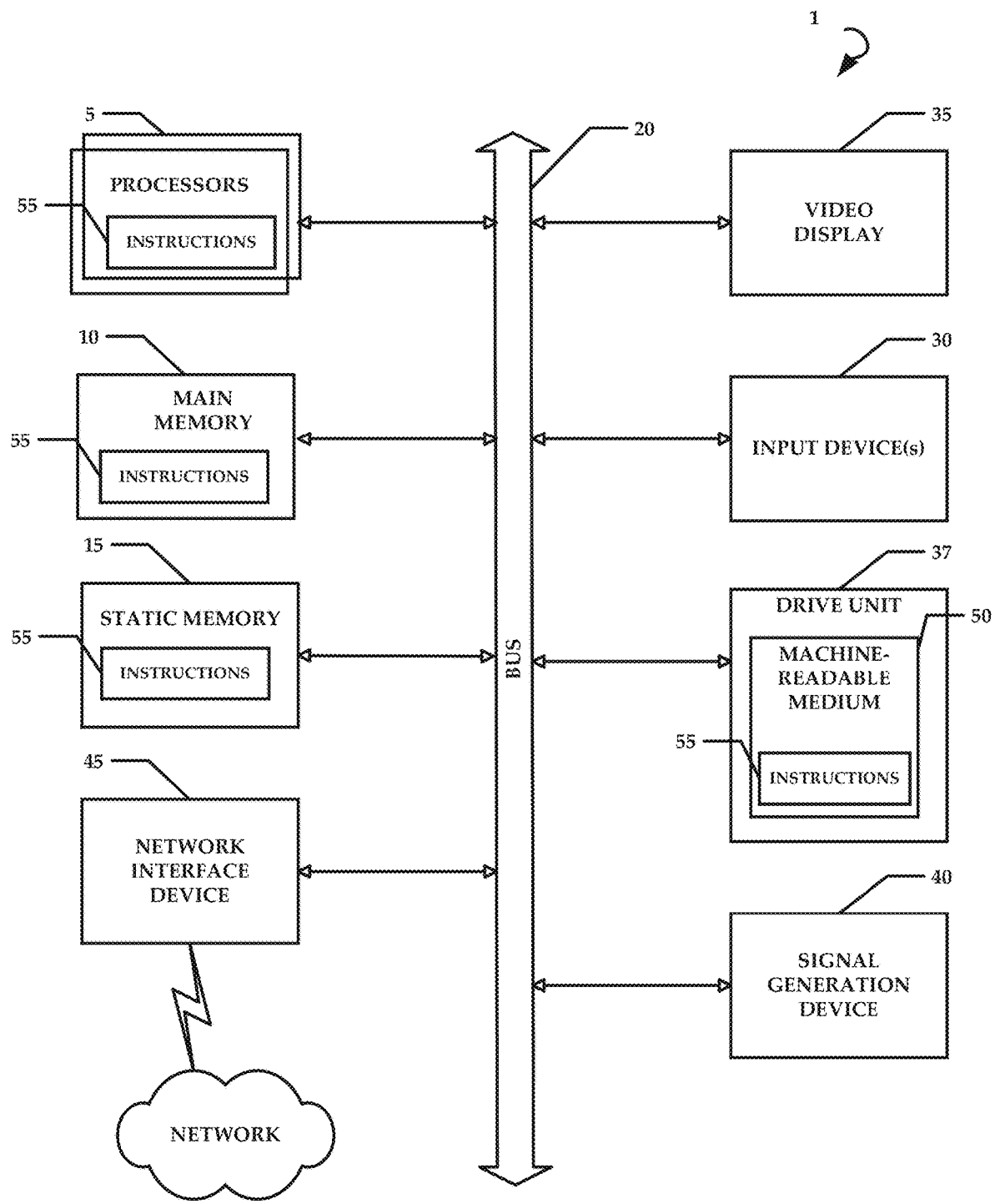
FIG. 8 is a schematic diagram of an exemplary computer system that is used to implement embodiments according to the present technology.

FIG. 8 is a diagrammatic representation of an example machine in the form of a computer system 1, within which a set of instructions for causing the machine to perform any one or more of the methodologies discussed herein may be executed. In various example embodiments, the machine operates as a standalone device or may be connected (e.g., networked) to other machines. In a networked deployment, the machine may operate in the capacity of a server or a client machine in a server-client network environment, or as a peer machine in a peer-to-peer (or distributed) network environment. The machine may be an Internet-of-Things device or system, a personal computer (PC), a tablet PC, a set-top box (STB), a personal digital assistant (PDA), a cellular telephone, a portable music player (e.g., a portable hard drive audio device such as a Moving Picture Experts Group Audio Layer 3 (MP3) player), a web appliance, a network router, switch or bridge, or any machine capable of executing a set of instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein.

The computer system 1 includes a processor or multiple processor(s) 5 (e.g., a central processing unit (CPU), a graphics processing unit (GPU), or both), and a main memory 10 and static memory 15, which communicate with each other via a bus 20. The computer system 1 may further include a video display 35 (e.g., a liquid crystal display (LCD)). The computer system 1 may also include an alphanumeric input device(s) 30 (e.g., a keyboard), a cursor control device (e.g., a mouse), a voice recognition or biometric verification unit (not shown), a drive unit 37 (also referred to as disk drive unit), a signal generation device 40 (e.g., a speaker), and a network interface device 45. The computer system 1 may further include a data encryption module (not shown) to encrypt data.

The drive unit 37 includes a computer or machine-readable medium 50 on which is stored one or more sets of instructions and data structures (e.g., instructions 55) embodying or utilizing any one or more of the methodologies or functions described herein. The instructions 55 may also reside, completely or at least partially, within the main memory 10 and/or within the processor(s) 5 during execution thereof by the computer system 1. The main memory 10 and the processor(s) 5 may also constitute machine-readable media.

The instructions 55 may further be transmitted or received over a network via the network interface device 45 utilizing any one of a number of well-known transfer protocols (e.g., Hyper Text Transfer Protocol (HTTP)). While the machine-readable medium 50 is shown in an example embodiment to be a single medium, the term "computer-readable medium" should be taken to include a single medium or multiple media (e.g., a centralized or distributed database and/or associated caches and servers) that store the one or more sets of instructions. The term "computer-readable medium" shall also be taken to include any medium that is capable of storing, encoding, or carrying a set of instructions for execution by the machine and that causes the machine to perform any one or more of the methodologies of the present application, or that is capable of storing, encoding, or carrying data structures utilized by or associated with such a set of instructions. The term "computer-readable medium" shall accordingly be taken to include, but not be limited to, solid-state memories, optical and magnetic media, and carrier wave signals. Such media may also include, without limitation, hard disks, floppy disks, flash memory cards, digital video disks, random access memory (RAM), read only memory (ROM), and the like. The example embodiments described herein may be implemented in an operating environment comprising software installed on a computer, in hardware, or in a combination of software and hardware.

The components provided in the computer system 1 are those typically found in computer systems that may be suitable for use with embodiments of the present disclosure and are intended to represent a broad category of such computer components that are well known in the art. Thus, the computer system 1 can be an Internet-of-Things device or system, a personal computer (PC), hand held computer system, telephone, mobile computer system, workstation, tablet, phablet, mobile phone, server, minicomputer, mainframe computer, wearable, or any other computer system. The computer may also include different bus configurations, networked platforms, multi-processor platforms, and the like. Various operating systems may be used including UNIX, LINUX, WINDOWS, MAC OS, PALM OS, QNX ANDROID, IOS, CHROME, TIZEN, and other suitable operating systems.

Some of the above-described functions may be composed of instructions that are stored on storage media (e.g., computer-readable medium). The instructions may be retrieved and executed by the processor. Some examples of storage media are memory devices, tapes, disks, and the like. The instructions are operational when executed by the processor to direct the processor to operate in accord with the technology. Those skilled in the art are familiar with instructions, processor(s), and storage media.

In some embodiments, the computer system 1 may be implemented as a cloud-based computing environment, such as a virtual machine operating within a computing cloud. In other embodiments, the computer system 1 may itself include a cloud-based computing environment, where the functionalities of the computer system 1 are executed in a distributed fashion. Thus, the computer system 1, when configured as a computing cloud, may include pluralities of computing devices in various forms, as will be described in greater detail below.

In general, a cloud-based computing environment is a resource that typically combines the computational power of a large grouping of processors (such as within web servers) and/or that combines the storage capacity of a large grouping of computer memories or storage devices. Systems that provide cloud-based resources may be utilized exclusively by their owners or such systems may be accessible to outside users who deploy applications within the computing infrastructure to obtain the benefit of large computational or storage resources.

The cloud is formed, for example, by a network of web servers that comprise a plurality of computing devices, such as the computer system 1, with each server (or at least a plurality thereof) providing processor and/or storage resources. These servers manage workloads provided by multiple users (e.g., cloud resource customers or other users). Typically, each user places workload demands upon the cloud that vary in real-time, sometimes dramatically. The nature and extent of these variations typically depends on the type of business associated with the user.

It is noteworthy that any hardware platform suitable for performing the processing described herein is suitable for use with the technology. The terms "computer-readable storage medium" and "computer-readable storage media" as used herein refer to any medium or media that participate in providing instructions to a CPU for execution. Such media can take many forms, including, but not limited to, non-volatile media, volatile media and transmission media. Non-volatile media include, for example, optical or magnetic disks, such as a fixed disk. Volatile media include dynamic memory, such as system RAM. Transmission media include coaxial cables, copper wire and fiber optics, among others, including the wires that comprise one embodiment of a bus. Transmission media can also take the form of acoustic or light waves, such as those generated during radio frequency (RF) and infrared (IR) data communications, as well as wireless communications (both short-range and long-range). Common forms of computer-readable media include, for example, a floppy disk, a flexible disk, a hard disk, magnetic tape, any other magnetic medium, a CD-ROM disk, digital video disk (DVD), any other optical medium, any other physical medium with patterns of marks or holes, a RAM, a PROM, an EPROM, an EEPROM, a FLASHEPROM, any other memory chip or data exchange adapter, a carrier wave, or any other medium from which a computer can read.

Various forms of computer-readable media may be involved in carrying one or more sequences of one or more instructions to a CPU for execution. A bus carries the data to system RAM, from which a CPU retrieves and executes the instructions. The instructions received by system RAM can optionally be stored on a fixed disk either before or after execution by a CPU.

Computer program code for carrying out operations for aspects of the present technology may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a standalone software package, partly on the user's computer and partly on a remote computer or entirely on the remote computer or server. In the latter scenario, the remote computer may be connected to the user's computer through any type of network, including a local area network (LAN) or a wide area network (WAN), personal area network (PAN), or the connection may be made to an external computer (for example, through the Internet using an Internet Service Provider).

The foregoing detailed description includes references to the accompanying drawings, which form a part of the detailed description. The drawings show illustrations in accordance with exemplary embodiments. These example embodiments, which are also referred to herein as "examples," are described in enough detail to enable those skilled in the art to practice the present subject matter. The embodiments can be combined, other embodiments can be utilized, or structural, logical, and electrical changes can be made without departing from the scope of what is claimed. The following detailed description is, therefore, not to be taken in a limiting sense, and the scope is defined by the appended claims and their equivalents.

In this document, the terms "a" or "an" are used, as is common in patent documents, to include one or more than one. In this document, the term "or" is used to refer to a nonexclusive "or," such that "A or B" includes "A but not B," "B but not A," and "A and B," unless otherwise indicated. Furthermore, all publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

The corresponding structures, materials, acts, and equivalents of all means or step plus function elements in the claims below are intended to include any structure, material, or act for performing the function in combination with other claimed elements as specifically claimed. The description of the present technology has been presented for purposes of illustration and description, but is not intended to be exhaustive or limited to the invention in the form disclosed. Many modifications and variations will be apparent to those of ordinary skill in the art without departing from the scope and spirit of the invention. Exemplary embodiments were chosen and described in order to best explain the principles of the present technology and its practical application, and to enable others of ordinary skill in the art to understand the invention for various embodiments with various modifications as are suited to the particular use contemplated.

While various embodiments have been described above, it should be understood that they have been presented by way of example only, and not limitation. The descriptions are not intended to limit the scope of the technology to the particular forms set forth herein. Thus, the breadth and scope of a preferred embodiment should not be limited by any of the above-described exemplary embodiments. It should be understood that the above description is illustrative and not restrictive. To the contrary, the present descriptions are intended to cover such alternatives, modifications, and equivalents as may be included within the spirit and scope of the technology as defined by the appended claims and otherwise appreciated by one of ordinary skill in the art. The scope of the technology should, therefore, be determined not with reference to the above description, but instead should be determined with reference to the appended claims along with their full scope of equivalents.

What is claimed is:

1. A method comprising:
    generating a first cyclic redundancy code (CRC) for a payload of a data packet by executing cycles for sets of input bytes from the payload using a CRC algorithm so as to reduce a number of the cycles required to generate the first CRC when compared to generating the first CRC from individual bits of the payload;
    for each of the sets of input bytes, shifting the first CRC leftward by a size value for the sets of input bytes;
    appending the first CRC to the payload of the data packet; and
    transmitting the data packet, including the first CRC appended to the payload of the data packet, over a wireless link from a source to a sink.

2. The method according to claim 1, wherein each of the sets of input bytes comprises at least eight bits.

3. The method according to claim 1, further comprising initializing a CRC register with an initial input.

4. The method according to claim 1, further comprising:
    storing a leftmost one of each of the sets of input bytes as a shifted byte set;
    precomputing combinations of logical values and shift combinations for updating the first CRC; and
    storing the combinations of logical values and shift combinations in memory.

5. The method according to claim 4, further comprising updating the first CRC by performing a logical operation on each of the sets of input bytes with the combinations of logical values and shift combinations stored in the memory.

6. The method according to claim 1, further comprising:
    calculating a second CRC by the sink, the sink comparing the second CRC with the first CRC; and
    transmitting a message to the source over the wireless link that indicates whether the second CRC calculated by the sink matches the first CRC by the source.

7. A system comprising:
    a source configured to:
        generate a first cyclic redundancy code (CRC) for a payload of a data packet by executing cycles for sets of input bytes from the payload using a CRC algorithm so as to reduce a number of the cycles required to generate the first CRC when compared to generating the first CRC from individual bits of the payload;
        for each of the sets of input bytes, shifting the first CRC leftward by a size value for the sets of input bytes;
        append the first CRC to the payload of the data packet; and
        transmit the data packet, including the first CRC appended to the payload of the data packet, over a wireless link; and
    a sink configured to:
        calculate a second CRC by the sink;
        compare the second CRC with the first CRC; and
        transmit a message to the source over the wireless link that indicates whether the second CRC calculated by the sink matches the first CRC by the source.

8. The system according to claim 7, wherein each of the sets of input bytes comprises at least eight bits.

9. The system according to claim 7, wherein the source is configured to initialize a CRC register with an initial input.

10. The system according to claim 7, in wherein the source is configured to:
    store a leftmost one of each of the sets of input bytes as a shifted byte set;
    precompute combinations of logical values and shift combinations for updating the first CRC; and
    store the combinations of logical values and shift combinations in memory.

11. The system according to claim 10, wherein the source is configured to update the first CRC by performing a logical operation on each of the sets of input bytes with the combinations of logical values and shift combinations stored in the memory.

12. A method comprising:
    generating a first cyclic redundancy code (CRC) by executing cycles for sets of input bytes from a payload by processing an initialized CRC register in combination with pre-computed values stored in a lookup table;
    initializing a CRC register with an initial input;
    for each of the sets of input bytes, shifting the first CRC leftward by a size value for the sets of input bytes;
    appending the first CRC to the payload of a data packet; and
    transmitting the data packet, including the first CRC appended to the payload of the data packet, over a wireless link from a source to a sink.

13. The method according to claim 12, wherein each of the sets of input bytes comprises at least eight bits.

14. The method according to claim 12, further comprising:
    storing a leftmost one of each of the sets of input bytes as a shifted byte set;
    precomputing combinations of logical values and shift combinations for updating the first CRC; and
    storing the combinations in the lookup table in memory.

15. The method according to claim 14, further comprising updating the first CRC by performing a logical operation on each of the sets of input bytes with the combinations stored in the memory.

16. The method according to claim 15, further comprising calculating a second CRC by the sink, the sink comparing the second CRC with the first CRC.

17. The method according to claim 16, further comprising transmitting a message to the source over the wireless link that indicates whether the second CRC calculated by the sink matches the first CRC by the source.

18. A method comprising:
    generating a first cyclic redundancy code (CRC) for a payload of a data packet by executing cycles for sets of input bytes from the payload using a CRC algorithm so as to reduce a number of the cycles required to generate the first CRC when compared to generating the first CRC from individual bits of the payload;
    updating the first CRC by performing a logical operation on each of the sets of input bytes with precomputed combinations of logical values and shift combinations stored in memory;
    appending the updated first CRC to the payload of the data packet; and
    transmitting the data packet, including the updated first CRC appended to the payload of the data packet, over a wireless link from a source to a sink.

* * * * *